(12) United States Patent
Hayashi

(10) Patent No.: US 12,406,968 B2
(45) Date of Patent: Sep. 2, 2025

(54) DISPLAY DEVICE

(71) Applicant: Japan Display Inc., Tokyo (JP)

(72) Inventor: Hirotaka Hayashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 536 days.

(21) Appl. No.: 17/941,088

(22) Filed: Sep. 9, 2022

(65) Prior Publication Data

US 2023/0005890 A1    Jan. 5, 2023

Related U.S. Application Data

(63) Continuation of application No. PCT/JP2021/001726, filed on Jan. 19, 2021.

(30) Foreign Application Priority Data

Mar. 27, 2020  (JP) .................................. 2020-058847

(51) Int. Cl.
*H01L 25/075* (2006.01)
*H10H 20/831* (2025.01)
*H10H 20/857* (2025.01)

(52) U.S. Cl.
CPC ..... *H01L 25/0753* (2013.01); *H10H 20/8312* (2025.01); *H10H 20/857* (2025.01)

(58) Field of Classification Search
CPC .............. H01L 25/0753; H01L 25/167; H10H 20/8312; H10H 20/857; G09G 3/3426; G09G 2300/0426; G09G 2310/024; G09G 3/3413; G09G 3/32; G09G 2330/04; G09G 2360/145
See application file for complete search history.

(56) References Cited

U.S. PATENT DOCUMENTS 12,283,604 B2 *  4/2025  Kang ...................... H10H 29/10
2014/0226329 A1 * 8/2014  Oraw .................. H01L 25/0753
                                                            362/249.02
(Continued)

FOREIGN PATENT DOCUMENTS

JP    2008227423 A    9/2008
WO    2015170493 A1   11/2015
WO    2019054178 A1   8/2020

OTHER PUBLICATIONS

Office Action issued on Sep. 26, 2023, in corresponding Japanese Application No. 2020-058847, 10 pages.

(Continued)

*Primary Examiner* — Victor A Mandala
(74) *Attorney, Agent, or Firm* — Maier & Maier, PLLC

(57) ABSTRACT

A display device includes a plurality of first pixels and a plurality of second pixels. Each of the plurality of first pixels includes a first LED chip including a first anode and a first cathode, a second LED chip including a second anode and a second cathode, and a first transistor. One of source and drain electrodes of the first transistor is electrically connected to a first power supply voltage line. The other of the source and drain electrodes is electrically connected to the first anode and the second cathode. The first cathode and the second anode are electrically connected to a second power supply voltage line. A first potential of the first power supply voltage line is different to a second potential of the second power supply voltage line.

19 Claims, 10 Drawing Sheets

(56) References Cited

U.S. PATENT DOCUMENTS

| | | | |
|---|---|---|---|
| 2015/0366017 A1 | 12/2015 | Clarke et al. | |
| 2017/0270861 A1 | 9/2017 | Izumi et al. | |
| 2018/0175104 A1* | 6/2018 | Kang | H10H 29/10 |
| 2019/0244559 A1 | 8/2019 | Cho et al. | |
| 2019/0251898 A1 | 8/2019 | Cho et al. | |
| 2019/0252471 A1 | 8/2019 | Inoue | |
| 2021/0202451 A1* | 7/2021 | Kong | H10H 20/857 |
| 2022/0005979 A1* | 1/2022 | Kang | H01L 25/0753 |
| 2022/0028923 A1* | 1/2022 | Li | H10H 20/831 |
| 2022/0069004 A1* | 3/2022 | Kang | H10H 29/41 |
| 2022/0077227 A1* | 3/2022 | Kang | H01L 25/0753 |
| 2022/0123026 A1* | 4/2022 | Oh | H10D 86/441 |
| 2022/0139319 A1* | 5/2022 | Oh | H01L 25/0753 345/204 |
| 2022/0140186 A1* | 5/2022 | Min | H01L 25/0753 257/79 |
| 2022/0149079 A1* | 5/2022 | Kang | H10D 86/60 |
| 2022/0149244 A1* | 5/2022 | Lee | H10H 20/8316 |
| 2022/0158052 A1* | 5/2022 | Lee | H10H 20/01 |
| 2022/0181522 A1* | 6/2022 | Moon | H10H 20/8316 |
| 2022/0216179 A1* | 7/2022 | Yang | H10H 20/01 |
| 2022/0231080 A1* | 7/2022 | Li | H10H 20/831 |
| 2022/0262984 A1* | 8/2022 | Choi | H10H 20/01 |
| 2022/0278253 A1* | 9/2022 | Yang | H01L 25/0753 |
| 2022/0285586 A1* | 9/2022 | Yang | H10H 20/01 |
| 2023/0106399 A1* | 4/2023 | Lee | H10H 20/821 257/79 |
| 2024/0055566 A1* | 2/2024 | Tae | H01L 25/167 |

OTHER PUBLICATIONS

International Search Report, issued on Mar. 9, 2021, in corresponding International Patent Application No. PCT/JP2021/001726; 6 pages.
English machine translation of Office Action dated Sep. 28, 2024, issued in CN Application No. 202180013661.6, 11 pages.
English machine translation of Office Action dated Feb. 11, 2025, issued in CN Appl. No. 202180013661.6, 7 pages.
English machine translation of Office Action dated Apr. 24, 2025, issued in CN Appl. No. 202180013661.6, 10 pages.

* cited by examiner

DISPLAY DEVICE

CROSS-REFERENCE TO RELATED APPLICATIONS

This application is a Continuation of International Patent Application No. PCT/JP2021/001726, filed on Jan. 19, 2021, which claims the benefit of priority to Japanese Patent Application No. 2020-058847, filed on Mar. 27, 2020, the entire contents of which are incorporated herein by reference.

FIELD

One embodiment of the present invention relates to a display device using an LED chip.

BACKGROUND

A liquid crystal display device is a display device that uses liquid crystals and a light source. In the liquid crystal display device, the arrangement of the liquid crystals is changed by applying a voltage to the liquid crystals. The light emitted from the light source is transmitted or shielded due to the difference in the arrangement of the liquid crystals. That is, in the liquid crystal display device, the liquid crystals are used as a switch to control the transmission or non-transmission of the light emitted from the light source.

A light emitting diode (LED) can be used for the light source of the liquid crystal display device. For example, a light source (also referred to as a backlight) in which a plurality of red LED chips, green LED chips, and blue LED chips are arranged in a matrix to obtain white light can be used as a light source of a liquid crystal display device.

However, the LED chip may be damaged by electrostatic discharge due to the application of a voltage in the opposite direction. Therefore, in order to prevent electrostatic discharge damage of the LED chip, a configuration in which a protection diode is connected in parallel to the LED chip is known (see, for example, Japanese Patent Application Laid-Open Publication No. 2008-227423).

On the other hand, focusing on a light emitting element included in the display device, in recent years, a micro LED display device in which a minute LED chip is arranged in each of a plurality of pixels has been developed. The micro LED display device is a self-luminous display device different from the liquid crystal display device, and has excellent visibility. In addition, the LED chip has high emission efficiency and a long life time. Therefore, the micro LED display device is expected to replace the organic EL display device as a next-generation display.

SUMMARY

A display device includes a plurality of first pixels and a plurality of second pixels. Each of the plurality of first pixels includes a first LED chip including a first anode and a first cathode, a second LED chip including a second anode and a second cathode, and a first transistor. One of source and drain electrodes of the first transistor is electrically connected to a first power supply voltage line. The other of the source and drain electrodes is electrically connected to the first anode and the second cathode. The first cathode and the second anode are electrically connected to a second power supply voltage line. A first potential of the first power supply voltage line is different to a second potential of the second power supply voltage line.

DESCRIPTION OF EMBODIMENTS

Figure 1:
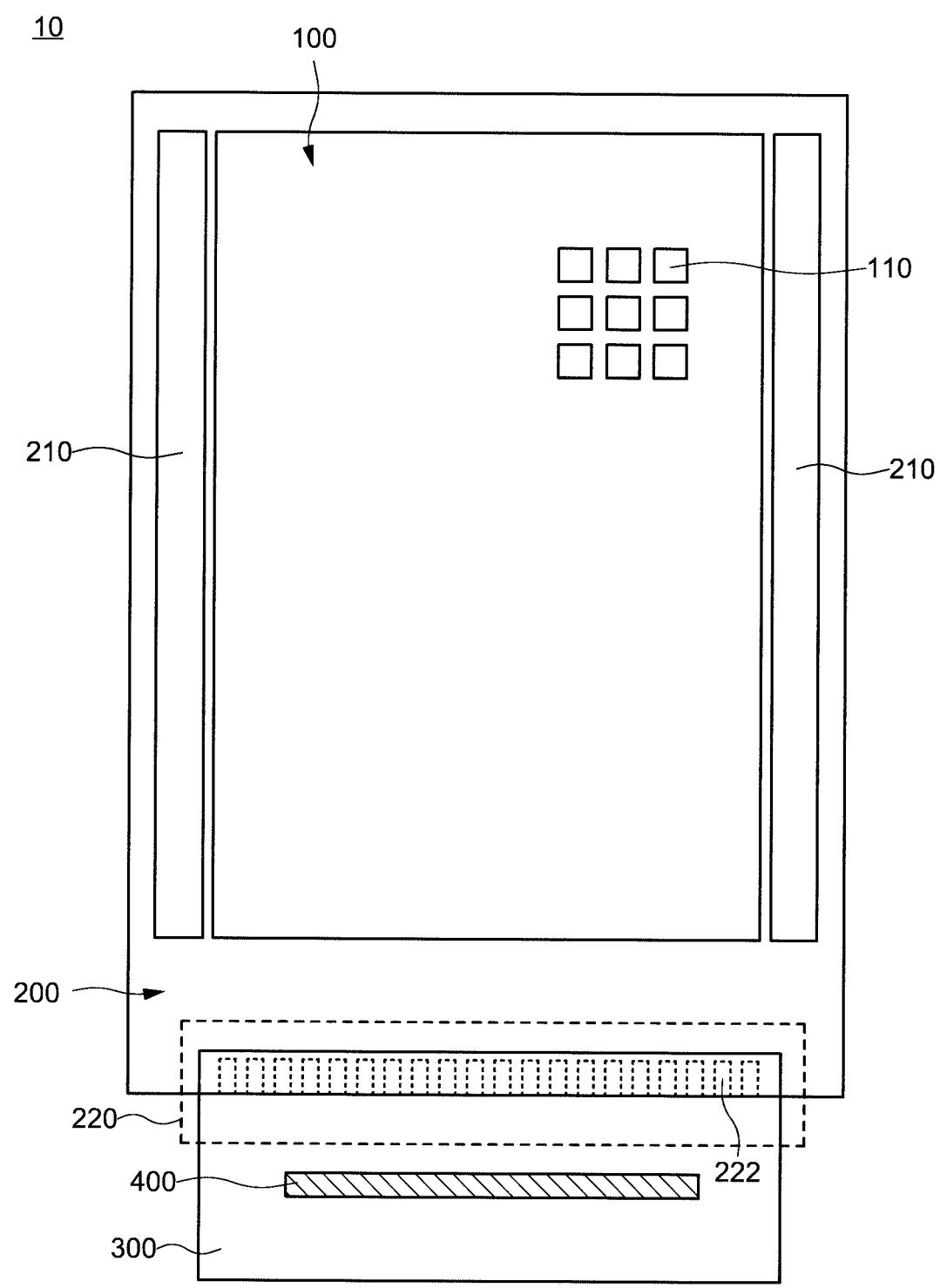
FIG. 1 is a schematic plan view of a display device according to an embodiment of the present invention.

In the light source of Japanese Patent Application Laid-Open Publication No. 2008-227423, since a protection diode needs to be formed separately from the LED chip, manufacturing costs increase. Further, although Japanese Patent Application Laid-Open Publication No. 2008-227423 describes that the LED chip can be used for the protection diode, the LED chip does not directly constitute the light emission of the light source.

One of the objects of an embodiment of the present invention is to provide a display device with a high electrostatic withstand voltage in which an LED chip is used for a light source or a display element.

Each embodiment of the present invention is described below while referring to the drawings. However, the present invention can be implemented in various modes without departing from the gist of the invention and should not be interpreted as being limited to the description of the embodiments exemplified below.

Although the drawings may be schematically represented in terms of width, thickness, shape, and the like of each part as compared with their actual mode in order to make explanation clearer, it is only an example and an interpretation of the present invention is not limited. In addition, in the drawings, the same reference numerals are provided to the same elements as those described previously with reference to preceding figures and repeated explanations may be omitted accordingly.

In the case when a single film is processed to form a plurality of structural bodies, each structural body may have different functions and roles, and the bases formed beneath each structural body may also be different. However, the plurality of structural bodies is derived from films formed in the same layer by the same process and have the same material. Therefore, the plurality of these films is defined as existing in the same layer.

When expressing a mode in which another structure is arranged over a certain structure, in the case where it is simply described as "over", unless otherwise noted, a case where another structure is arranged directly over a certain structure as if in contact with that structure, and a case where another structure is arranged via another structure over a certain structure, are both included.

In each embodiment of the present invention, as a general rule, the direction from a substrate where a transistor is formed to an LED chip is referred to as "upper" direction and is shown.

First Embodiment

A configuration of a display device 10 according to an embodiment of the present invention is described with reference to FIGS. 1 to 5.

FIG. 1 is a plan view of the display device 10 according to the embodiment of the present invention.

As shown in FIG. 1, the display device 10 includes a display region 100 and a peripheral region 200. The peripheral region 200 is located outside the display region 100.

The display region 100 is a region for displaying an image or a moving image. Although the shape of the display region 100 shown in FIG. 1 is a rectangle having a long side and a short side, the configuration of the shape of the display region 100 is not limited to this shape. The shape of the display region 100 can be any shape that matches the size or shape of the display device 10, such as a polygon, a circle, or an ellipse.

The display region 100 includes a plurality of pixels 110. The plurality of pixels 110 shown in FIG. 1 are arranged in a matrix. However, the configuration of the arrangement of the plurality of pixels 110 is not limited to this arrangement. The plurality of pixels 110 may be arranged in a staggered pattern, for example.

The peripheral region 200 includes a scanning line drive circuit portion 210 and a terminal portion 220. The scanning line drive circuit portion 210 shown in FIG. 1 is provided along the long side direction of the rectangle of the display region 100. However, the position of the scanning line drive circuit unit 210 is not limited to this. The scanning line drive circuit portion 210 may be provided, for example, along the short side direction of the rectangle of the display region 100.

Although the scanning line drive circuit portion 210 shown in FIG. 1 is provided at two locations on the long sides of the rectangle of the display region 100, the scanning line drive circuit portion 210 may be provided at one location on the long side of the rectangle. Further, the scanning line drive circuit portion 210 may be provided on the short side of the rectangle of the display region 100.

In the display device 10, power or a signal can be supplied from the outside through the terminal portion 220. Therefore, the terminal portion 220 includes a plurality of terminals 222 that can be electrically connected to the outside. The plurality of terminals 222 shown in FIG. 1 are electrically connected to a flexible printed circuit substrate (FPC) 300. Further, a driver IC 400 is provided on the flexible printed circuit substrate 300.

The terminal portion 220 is provided at an end of the display device 10. A video signal and a control signal are supplied to the display device 10 from a controller (not shown) provided outside the display device 10 through the flexible printed circuit substrate 300. Further, the video signal and the control signal are converted into signals for the display device 10 through the driver IC 400, and are input to the plurality of pixels 110 and the scanning line drive circuit portion 210, respectively. Furthermore, not only the video signal and the control signal, but also power for driving the scanning line drive circuit portion 210, the driver IC 400, and the plurality of pixels 110 are supplied to the display device 10.

Figure 2:
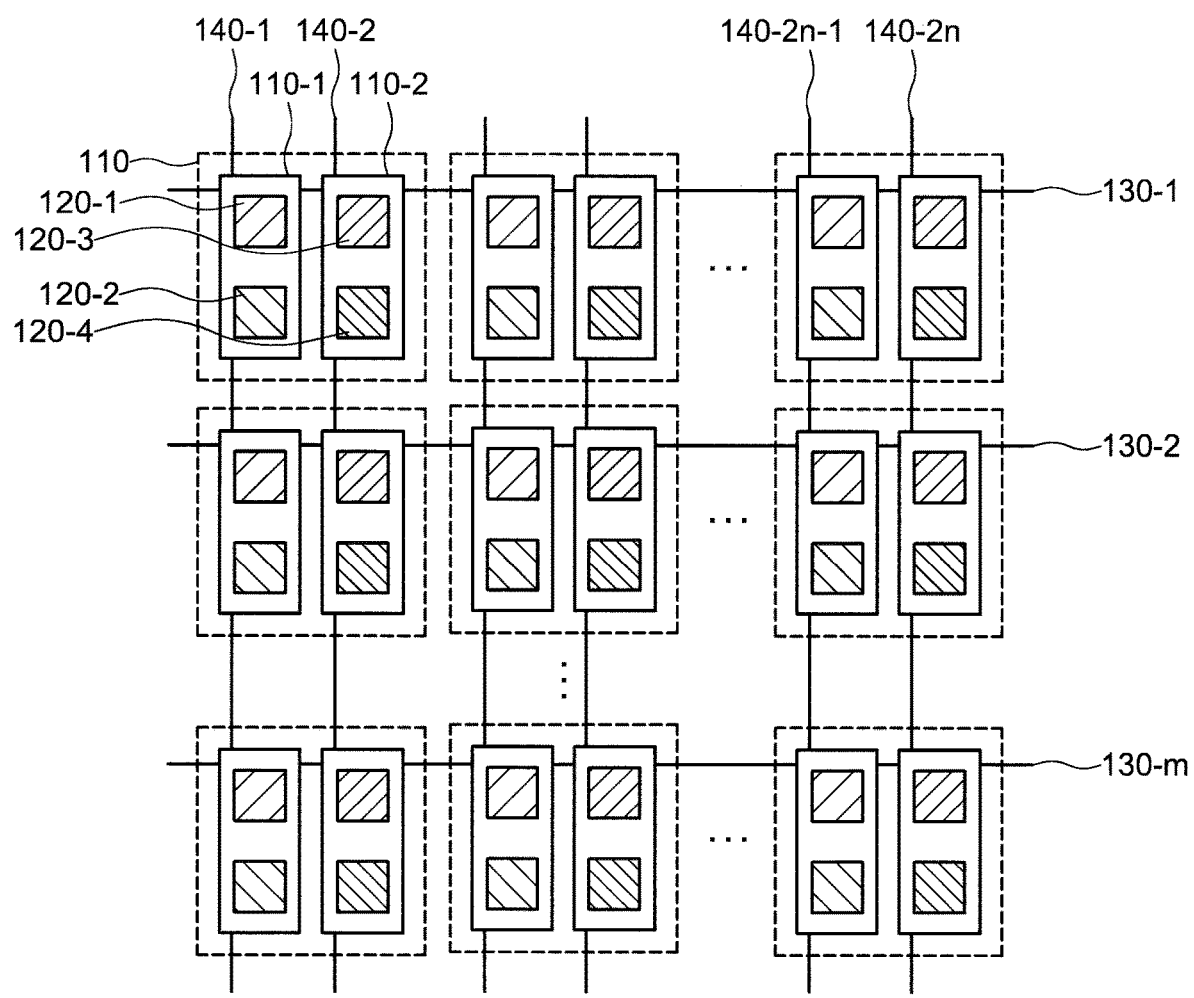
FIG. 2 is a plan view of an array of pixels in a display portion of a display device according to an embodiment of the present invention.

FIG. 2 is a plan view of the arrangement of pixels 110 in the display region 100 of the display device 10 according to the embodiment of the present invention.

In the display region 100 shown in FIG. 2, the plurality of pixels 110 are provided in a matrix of m rows×n columns (m and n are natural numbers). As shown in FIG. 2, each of the plurality of pixels 110 includes a first pixel 110-1 and a second pixel 110-2. The first pixel 110-1 is provided with a first LED chip 120-1 and a second LED chip 120-2. Further, the second pixel 110-2 is provided with a third LED chip 120-3 and a fourth LED chip 120-4. Each of the first LED chip 120-1, the second LED chip 120-2, the third LED chip 120-3, and the fourth LED chip 120-4 is, for example, a red LED chip, a green LED chip, a blue LED chip, and a white LED chip. That is, the first pixel 110-1 is a pixel capable of red light emission and green light emission, and the second pixel 110-2 is a pixel capable of blue light emission and white light emission.

In the following description, when the first LED chip 120-1, the second LED chip 120-2, the third LED chip 120-3, and the fourth LED chip 120-4 are not particularly distinguished, they may be described as the LED chip 120 for convenience.

Further, as shown in FIG. 2, the display region 100 includes a first scanning line 130-1, a second scanning line 130-2, and . . . , an m-th scanning line 130-$m$. Furthermore, the display region 100 includes a first data line 140-1, a second data line 140-2, . . . , a (2n−1)-th data line 140-2$n$−1, and a 2n-th data line 140-2$n$.

In the following description, when the first scanning line 130-1, the second scanning line 130-2, and . . . , the m-th scanning line 130-$m$ are not particularly distinguished, they are described as a scanning line 130 for convenience. Further, when explaining two adjacent scanning lines 130, for convenience, the two scanning lines 130 may be described as a first scanning line 130-1 and a second scanning line 130-2. Furthermore, when the first data line 140-1, the second data line 140-2, . . . , the (2n−1)-th data line 140-2$n$−1, and the second n data line 140-2$n$ are not particularly distinguished, they may be described as a data line 140, for convenience. In addition, when explaining two adjacent data lines 140 connected to one pixel 110, for convenience, the two data lines 140 may be described as a first data line 140-1 and a second data line 140-2.

The scanning line 130 is provided for each pixels 110 in the m row. That is, one scanning line 130 is provided so as to connect to the plurality of pixels 110 arranged in one row. On the other hand, two data lines 140 are provided for each pixels 110 in the n column. That is, the two data lines 140 are provided so as to be commonly connected to the plurality of pixels 110 arranged in one column.

Here, the connection relationship between the first pixel 110-1 and the second pixel 110-2 and the scanning line 130 and the data lines 140 in one pixel 110 is described. The scanning line 130 is provided so as to be commonly connected to the first pixel 110-1 and the second pixel 110-2. On the other hand, the data lines 140 are provided so that the first data line 140-1 and the second data line 140-2 are connected to the first pixel 110-1 and the second pixel 110-2, respectively. Therefore, in the pixel 110, the first LED chip 120-1 or the second LED chip 120-2 provided in the first pixel 110-1 can emit light by selecting the scanning line 130 and the first data line 140-1. Similarly, the third LED chip 120-3 or the fourth LED chip 120-4 provided in the second pixel 110-2 can emit light by selecting the scanning line 130 and the second data line 140-2.

A pixel circuit for driving the pixel 110 is described with reference to FIG. 3.

Figure 3:
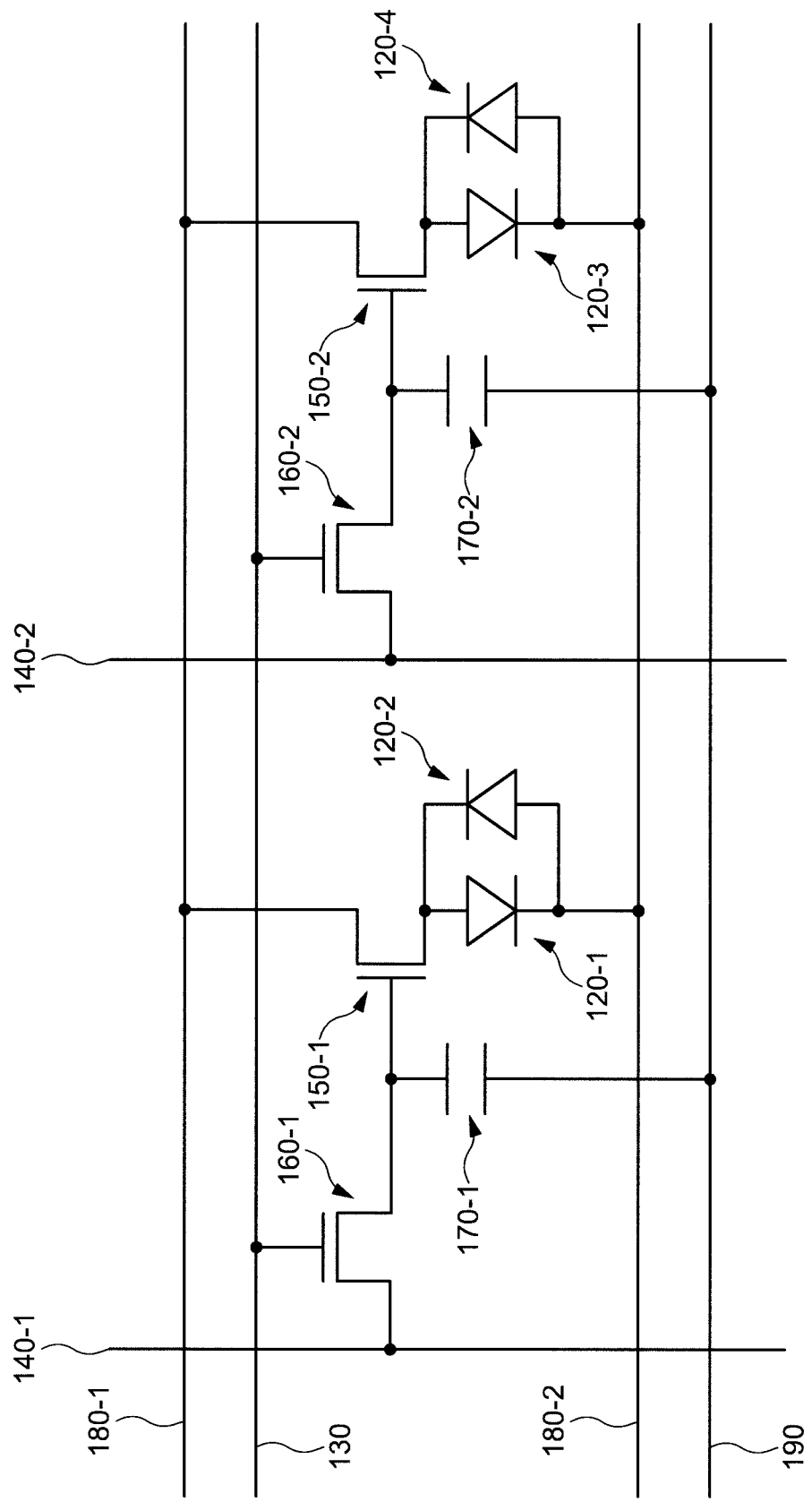
FIG. 3 is a circuit diagram of a pixel circuit in a pixel of a display device according to an embodiment of the present invention.

FIG. 3 is a circuit diagram of the pixel circuit in the pixel 110 of the display device 10 according to the embodiment of the present invention.

As shown in FIG. 3, the pixel 110 includes the first LED chip 120-1, the second LED chip 120-2, the third LED chip 120-3, the fourth LED chip 120-4, the scanning line 130, the first data line 140-1, the second data line 140-2, a first drive transistor 150-1, a second drive transistor 150-2, a first selection transistor 160-1, a second selection transistor 160-2, a first capacitance element 170-1, a second capacitance element 170-2, a first power supply voltage line 180-1, a second power supply voltage line 180-2, and a capacitance line 190.

The first pixel 110-1 includes the first LED chip 120-1, the second LED chip 120-2, the first drive transistor 150-1, the first selection transistor 160-1, and the first capacitive element 170-1, and the scanning line 130, the first data line 140-1, the first power supply voltage line 180-1, the second power supply voltage line 180-2, and the capacitance line 190 are connected to the first pixel 110-1. On the other hand, the second pixel 110-2 includes the third LED chip 120-3, the fourth LED chip 120-4, the second drive transistor 150-2, the second selection transistor 160-2, and the second capacitance element 170-2, and the scanning line 130, the second data line 140-2, the first power supply voltage line 180-1, the second power supply voltage line 180-2, and the capacitance line 190 are connected to the second pixel 110-2.

Since the drive of the second pixel 110-2 is the same as the drive of the first pixel 110-1, the connection relationship and the drive in the first pixel 110-1 is described here, and the description of the connection relationship and the drive in the second pixel 110-2 is omitted.

The scanning line 130 is electrically connected to a gate electrode of the first selection transistor 160-1. One of source and drain electrodes of the first selection transistor 160-1 is electrically connected to the first data line 140-1, and the other of the source and drain electrodes of the first selection transistor 160-1 is electrically connected to a gate electrode of the first drive transistor 150-1. One of source and drain electrodes of the first drive transistor 150-1 is electrically connected to the first power supply voltage line 180-1, and the other of the source and drain electrodes of the first drive transistor 150-1 is electrically connected to an anode of the first LED chip 120-1 and a cathode of the second LED chip 120-2. A cathode of the first LED chip 120-1 and an anode of the second LED chip 120-2 are electrically connected to the second power supply voltage line 180-2. One electrode of the first capacitance element 170-1 is electrically connected to the other of the source and drain electrodes of the first selection transistor 160-1, and the other electrode of the first capacitance element 170-1 is electrically connected to the capacitance line 190.

When the scanning line 130 is selected, the first selection transistor 160-1 is turned on, and a signal voltage is supplied from the first data line 140-1 to the gate electrode of the first drive transistor 150-1. Further, the first drive transistor 150-1 is turned on, and a current corresponding to the signal voltage is supplied from the first power supply voltage line 180-1 or the second power supply voltage line 180-2 to the first LED chip 120-1 or the second LED chip 120-2.

The first LED chip 120-1 and the second LED chip 120-2 are electrically connected in parallel. However, the first LED chip 120-1 and the second LED chip 120-2 are connected in parallel so that their polarities are opposite to each other. That is, when current is supplied to the first LED chip 120-1, no current is supplied to the second LED chip 120-2. Similarly, when current is supplied to the second LED chip 120-2, no current is supplied to the first LED chip 120-1.

A first potential of the first power supply voltage line 180-1 is different from a second potential of the second power supply voltage line 180-2. When the first potential is larger than the second potential, current is supplied only from the first power supply voltage line 180-1 to the first LED chip 120-1. That is, the first LED chip 120-1 is in a light emitting state, and the second LED chip 120-2 is in a non-light emitting state. On the other hand, when the second potential is larger than the first potential, current is supplied only from the second power supply voltage line 180-2 to the second LED chip 120-2. That is, the second LED chip 120-2 is in a light emitting state, and the first LED chip 120-1 is in a non-light emitting state. Therefore, one of the LED chips 120 of the two LED chips 120 of the first pixel 110-1 can be in a light emitting state, and the other LED chip 120 can be used as a protection diode.

The switching of the potential between the first power supply voltage line 180-1 and the second power supply voltage line 180-2 may be controlled by a circuit provided on the substrate 500, or may be controlled by the driver IC 400.

The drive of the pixel circuit is further described with reference to FIG. 4.

Figure 4:
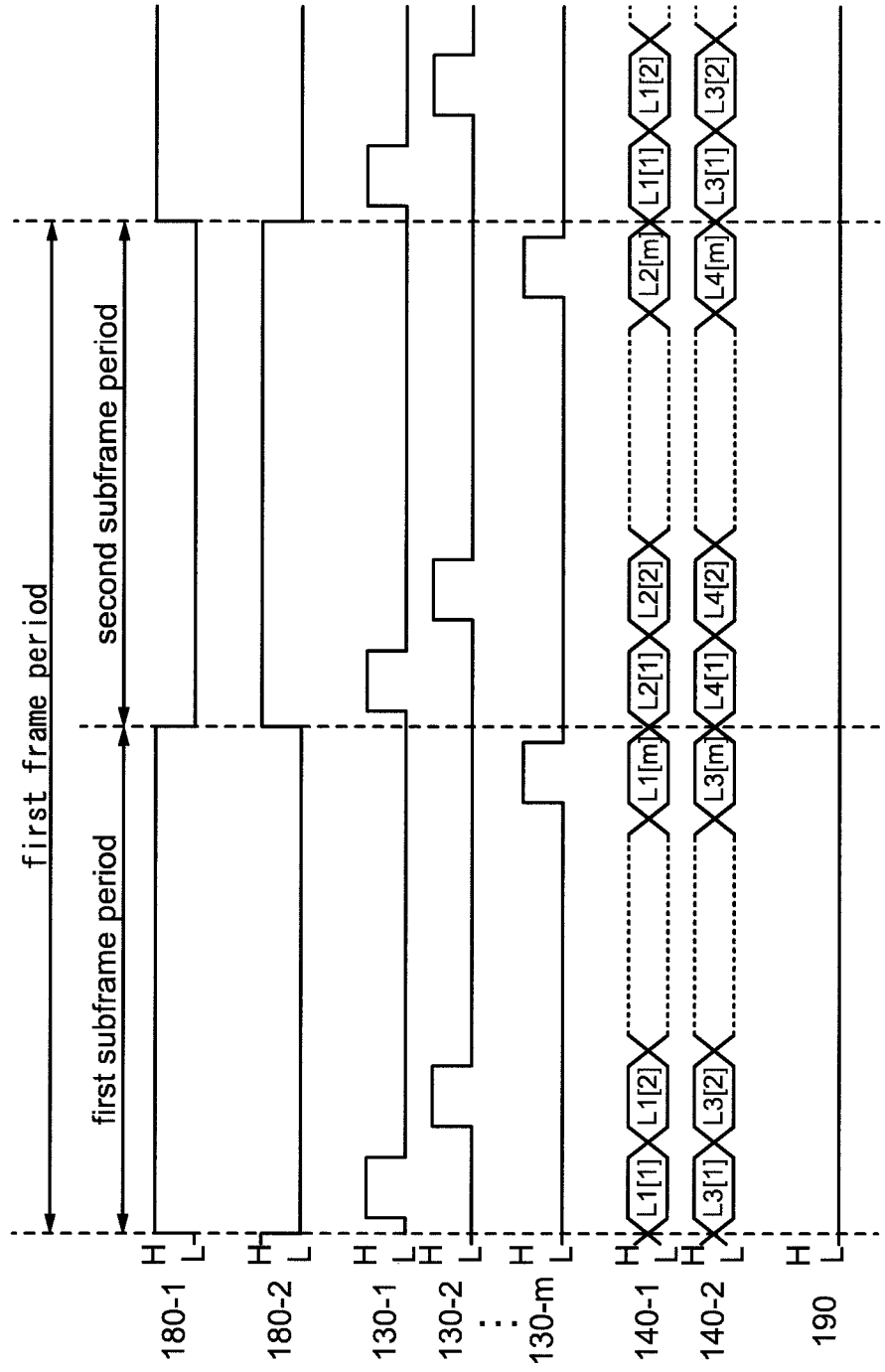
FIG. 4 is a timing chart of a pixel circuit of a display device according to an embodiment of the present invention.

FIG. 4 is a timing chart of the pixel circuit of the display device 10 according to the embodiment of the present invention. FIG. 4 shows each potential of the first scanning line 130-1, the second scanning line 130-2, . . . , the m-th scanning line 130-$m$, the first data line 140-1, the second data line 140-2, the first power supply voltage line 180-1, the second power supply voltage line 180-2, and the capacitance line.

The display device 10 includes a first subframe period and a second subframe period in one frame period.

In the first subframe period, the first potential of the first power supply voltage line 180-1 is a high potential ("H" in FIG. 4), and the second potential of the second power supply voltage line 180-2 is a low potential ("L" in FIG. 4). Therefore, during the first subframe period, the first LED chip 120-1 of the first pixel 110-1 and the third LED chip 120-3 of the second pixel 110-2 are in a light emitting state.

When the first scanning line 130-1 is selected ("H" in FIG. 4), light emission from the LED chips 120 of the plurality of pixels 110 arranged in the first row becomes possible. When the second scanning line 130-2 is selected ("H" in FIG. 4), light emission from the LED chips 120 of the plurality of pixels 110 arranged in the second row becomes possible. Similarly, when the m-th scanning line 130-$m$ is selected ("H" in FIG. 4), light emission from the LED chips 120 of the plurality of pixels 110 arranged in the m-th row becomes possible.

In each of the plurality of pixels 110, when the first data line 140-1 is selected ("H" in FIG. 4), light emission from the first LED chip 120-1 of the first pixel 110-1 becomes possible ("L1[1]", "L1[2]", . . . , "L1 [m]" in FIG. 4). Further, when the second data line 140-2 is selected ("H" in FIG. 4), light emission from the third LED chip 120-3 of the second pixel 110-2 becomes possible ("L3[1]", "L3[2]", . .

. , "L3[m]" in FIG. 4). That is, the first data line 140-1 and the second data line 140-2 are sequentially selected in each of the plurality of pixels 110.

In the second subframe period, the second potential of the second power supply voltage line 180-2 is a high potential ("H" in FIG. 4), and the first potential of the first power supply voltage line 180-1 is a low potential ("L" in FIG. 4). Therefore, during the second subframe period, the second LED chip 120-2 of the first pixel 110-1 and the fourth LED chip 120-4 of the second pixel 110-2 are in the light emitting state.

When the first scanning line 130-1 is selected ("H" in FIG. 4), light emission from the LED chips 120 of the plurality of pixels 110 arranged in the first row becomes possible. When the second scanning line 130-2 is selected ("H" in FIG. 4), light emission from the LED chips 120 of the plurality of pixels 110 arranged in the second row becomes possible. Similarly, when the m-th scanning line 130-m is selected ("H" in FIG. 4), light emission from the LED chips 120 of the plurality of pixels 110 arranged in the m-th row becomes possible.

In each of the plurality of pixels 110, when the first data line 140-1 is selected ("H" in FIG. 4), light emission from the first LED chip 120-2 of the first pixel 110-1 becomes possible ("L2[1]", "L2[2]", . . . , "L2[m]" in FIG. 4). Further, when the second data line 140-2 is selected ("H" in FIG. 4), light emission from the third LED chip 120-4 of the second pixel 110-2 becomes possible ("L4[1]", "L4[2]", . . . , "L4[m]" in FIG. 4). That is, the first data line 140-1 and the second data line 140-2 are sequentially selected in each of the plurality of pixels 110.

Therefore, the first LED chip 120-1 and the third LED chip 120-3 can emit light during the first subframe, and the second LED chip 120-2 and the fourth LED chip 120-4 can emit light during the second subframe period. In the display device 10, the first subframe period and the second subframe period are sequentially and repeatedly selected. When the first LED chip 120-1, the second LED chip 120-2, the third LED chip 120-3, and the fourth LED chip 120-4 are a red LED chip, a green LED chip, a blue LED chip, and a white LED chip, respectively, the display device 10 is capable of full-color display by sequentially selecting the first subframe period and the second subframe period.

A configuration of the pixel 110 of the display device 10 is described with reference to FIG. 5.

Figure 5:
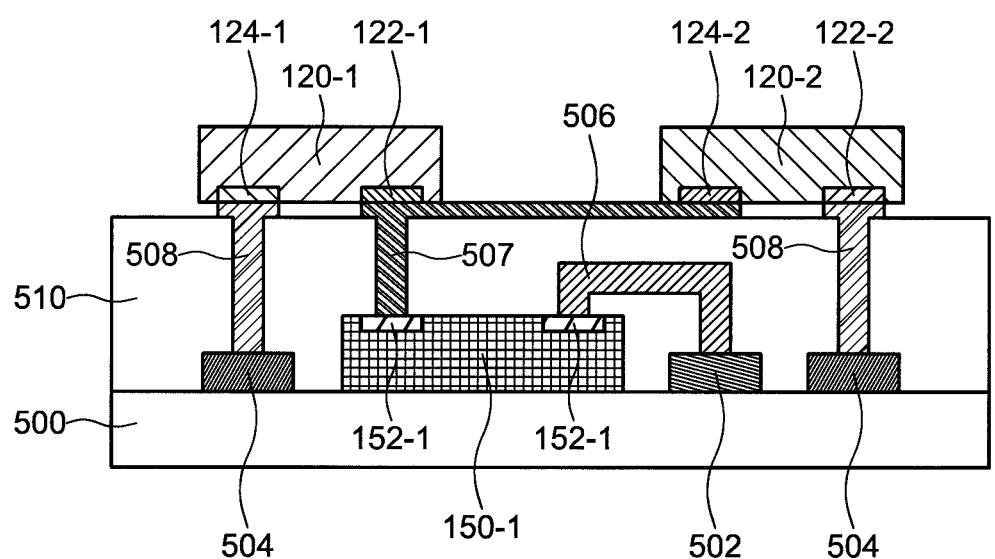
FIG. 5 is a cross-sectional view of a pixel of a display device according to an embodiment of the present invention.

FIG. 5 is a cross-sectional view of the pixel 110 of the display device 10 according to the embodiment of the present invention. Specifically, FIG. 5 is a cross-sectional view of the first pixel 110-1. Since the configuration of the second pixel 110-2 is the same as the configuration of the first pixel 110-1, the configuration of the first pixel 110-1 is described here, and the description of the configuration of the second pixel 110-2 is omitted.

As shown in FIG. 5, the first pixel 110-1 includes a substrate 500, a first wiring layer 502, a second wiring layer 504, a third wiring layer 506, a fourth wiring layer 507, a fifth wiring layer 508, a protection layer 510, the first LED chip 120-1, the second LED chip 120-2, and the first drive transistor 150-1. The first pixel 110-1 also includes the first selection transistor 160-1 and the first capacitance element 170-1. The first selection transistor 160-1 can have the same configuration as the first drive transistor 150-1, and the first capacitance element 170-1 has a configuration using the insulating layer and electrodes of the first drive transistor 150-1. Therefore, the description of the configurations of the first selection transistor 160-1 and the first capacitance element 170-1 is omitted here.

The first drive transistor 150-1 includes source and drain electrodes 152-1. The first drive transistor 150-1 may be a top gate type transistor or a bottom gate type transistor. Further, the semiconductor layer of the first drive transistor 150-1 may be silicon (amorphous silicon, or polysilicon, etc.), and an oxide semiconductor (zinc oxide (ZnO), gallium oxide ($Ga_2O_3$), or indium gallium zinc oxide (IGZO)). Further, the first drive transistor 150-1 may be a p-channel type or an n-channel type.

The first LED chip 120-1 includes a first anode 122-1 and a first cathode 124-1. The second LED chip 120-2 includes a second anode 122-2 and a second cathode 124-2. Although the LED chip 120 shown in FIG. 5 has a horizontal LED structure (horizontal electrode structure), the structure of the LED chip 120 is not limited to this structure. The LED chip 120 may have a vertical LED structure (vertical electrode structure).

As shown in FIG. 5, the first wiring layer 502, the second wiring layer 504, and the first drive transistor 150-1 are provided over the substrate 500. Further, the protective layer 510 is provided so as to cover the first wiring layer 502, the second wiring layer 504, and the first drive transistor 150-1. The third wiring layer 506 may be provided in the protective layer 510. Each of the fourth wiring layer 507 and the fifth wiring layer 508 is provided on the opening of the protective layer 510 and the protective layer 510. Each of the first LED chip 120-1 and the second LED chip 120-2 is provided on the third wiring layer 506 and the fourth wiring layer.

The substrate 500 can function as a support substrate that supports each layer provided on the substrate 500. For example, a rigid substrate such as a glass substrate, a quartz substrate, and a sapphire substrate can be used as the substrate 500. When the substrate 500 is a transparent substrate, the display region 100 of the display device 10 has transparency. Further, for example, a flexible substrate such as a polyimide substrate, an acrylic substrate, a siloxane substrate, or a fluororesin substrate can be used as the substrate 500. Impurities may be introduced into the flexible substrate in order to improve the heat resistance of the flexible substrate. When the substrate 500 does not require transparency, for example, a silicon substrate, a silicon carbide substrate, a semiconductor substrate such as a compound semiconductor substrate, or a conductive substrate such as a stainless steel substrate may be used as the substrate 500. The substrate 500 may have a silicon oxide film or a silicon nitride film formed on the above-mentioned substrate.

The first wiring layer 502 can function as a wiring for the first power supply voltage line 180-1. For example, a metal such as aluminum (Al), titanium (Ti), molybdenum (Mo), copper (Cu), or tungsten (W), or an alloy thereof can be used as the material of the first wiring layer 502. Further, the first wiring layer 502 can be a single layer or a stacked layer.

The second wiring layer 504 can function as a wiring for the second power supply voltage line 180-2. The same material as that of the first wiring layer 502 can be used for the second wiring layer 504.

The third wiring layer 506 can function as a wiring for electrically connecting the first wiring layer 502 and one of the source and drain electrodes 152-1 of the first drive transistor 150-1. The same material as that of the first wiring layer 502 can be used for the third wiring layer 506.

The fourth wiring layer 507 can function as a wiring for electrically connecting the other of the source and drain electrodes 152-1 of the first drive transistor 150-1 to the second anode 122-1 of the first LED chip 120-1 and the second LED chip 120-2. The same material as that of the first wiring layer 502 can be used for the fourth wiring layer 507.

The fifth wiring layer 508 can function as a wiring for electrically connecting the second wiring layer 504 to the first cathode 124-1 of the first LED chip 120-1 and the second wiring layer 504 to the second anode 122-2 of the second LED chip 120-2. The same material as that of the first wiring layer 502 can be used for the fifth wiring layer 508.

Each of the first LED chip 120-1 and the second LED chip 120-2 can be mounted on the fourth wiring layer 507 and the fifth wiring layer 508 through a conductive adhesive. Therefore, an adhesive layer is provided between the fourth wiring layer 507 and the first anode 122-1 and the second cathode, between the fifth wiring layer 508 and the first cathode 124-1, and between the fifth wiring layer 508 and the second anode 122-2. For example, silver paste or solder can be used for the conductive adhesive. Further, an anisotropic conductive film (ACF) can also be used for the adhesive layer.

The protection layer 510 can protect the first drive transistor 150-1 and flatten steps of the first drive transistor 150-1. For example, an organic material such as photosensitive acrylic or photosensitive polyimide can be used as the material of the protection layer 510. Further, for example, an inorganic material such as silicon oxide, silicon nitride, aluminum oxide, or aluminum nitride can be used as the material of the protective layer 510. Furthermore, the protection layer 510 may be a single layer or a stacked layer. When the protective layer 510 is a stacked layer, a stacked layer in which an inorganic material and an organic material are combined can be used.

As described above, in the display device 10 according to the first embodiment, two LED chips 120 can be driven by using one pixel circuit. Therefore, the number of pixel circuits formed in the display region 100 can be reduced. In addition, the number of pixels in the display region 100 can be increased. Therefore, the display device 10 is a high-definition display device. Further, since the number of pixel circuits formed in the display region 100 can be reduced, the aperture ratio of the display region 100 can be increased. Therefore, since the display region 100 has high transparency, the display device 10 is a display device having high transparency. Furthermore, in the display device 10, one LED chip 120 of the two LED chips 120 that contribute to white light emission can be in a light emitting state and the other LED chip 120 can be used as a protection diode. Therefore, the display device 10 is a display device having a high electrostatic withstand voltage.

Further, the fourth LED chip 120-4 is not limited to a white LED, and may be an LED that emits any of the colors red, blue, and green. That is, the fourth LED chip 120-4 may be an LED that emits the same color as any one of the first LED chip 120-1, the second LED chip 120-2, and the third LED chip 120-3.

Furthermore, the emission colors of the first LED chip 120-1, the second LED chip 120-2, the third LED chip 120-3, and the fourth LED chip 120-4 may be selected in consideration of the color balance of the display device 10. That is, the first LED chip 120-1, the second LED chip 120-2, the third LED chip 120-3, and the fourth LED chip 120-4 can be any combination of emission colors. For example, the first pixel 110-1 is a pixel capable of emitting red light using two red LED chips 120R, and the second pixel 110-2 is a pixel capable of emitting green and blue using a green LED chip 120G and a blue LED chip 120B.

Second Embodiment

A configuration of a display device 20 according to an embodiment of the present invention is described with reference to FIGS. 6 to 8B.

Figure 6:
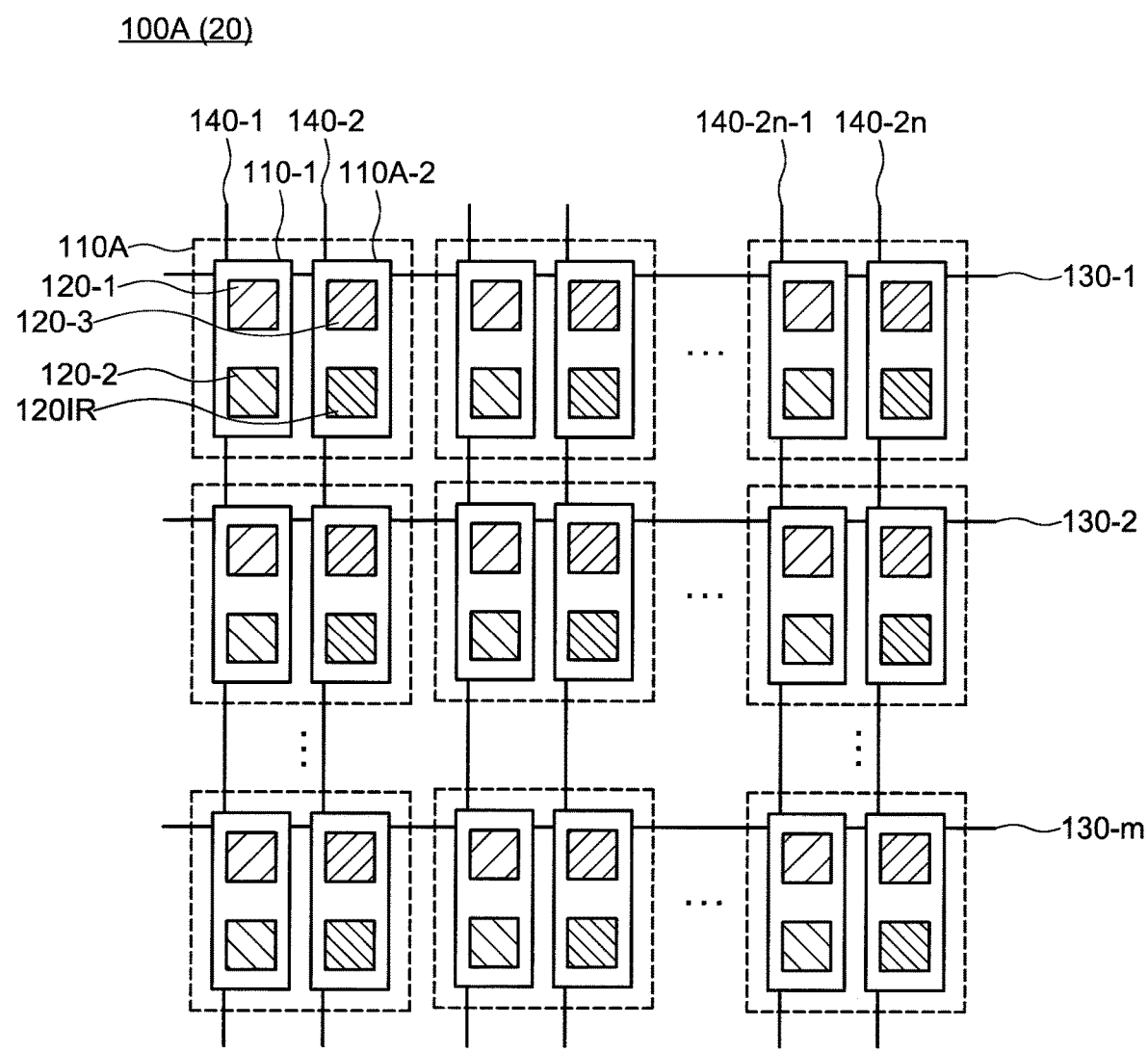
FIG. 6 is a plan view of an arrangement of pixels in a display portion of a display device according to an embodiment of the present invention.

FIG. 6 is a plan view of an arrangement of pixels 110A in a display region 100A of the display device 20 according to the embodiment of the present invention. In the following description, the description of the same configuration as the display region 100 of the display device 10 according to the first embodiment is omitted, and the configuration different from the display region 100 is mainly described.

As shown in FIG. 6, each of the plurality of pixels 110A includes the first pixel 110-1 and a second pixel 110A-2. The first pixel 110-1 is provided with the first LED chip 120-1 and the second LED chip 120-2. Further, the second pixel 110A-2 is provided with the third LED chip 120-3 and an infrared LED chip 1201R.

Each of the first LED chip 120-1, the second LED chip 120-2, and the third LED chip 120-3 is, for example, any one of a red LED chip, a green LED chip, a blue LED chip, and a white LED chip. It is preferable that the pixel 110A can obtain white light emission by controlling the first LED chip 120-1, the second LED chip 120-2, and the third LED chip 120-3.

Further, as shown in FIG. 6, the display region 100A includes the first scanning line 130-1, the second scanning line 130-2, and . . . , the m-th scanning line 130-m. Furthermore, the display region 100A includes the first data line 140-1, a second data line 140-2, . . . , the (2n−1)-th data line 140-2n−1, and the 2n-th data line 140-2n.

The scanning line 130 is provided so as to be commonly connected to the first pixel 110-1 and the second pixel 110A-2. On the other hand, the data line 140 is provided so that the first data line 140-1 and the second data line 140-2 are connected to the first pixel 110-1 and the second pixel 110A-2, respectively. Therefore, in the pixel 110A, the first LED chip 120-1 or the second LED chip 120-2 provided in the first pixel 110-1 can emit light by selecting the scanning line 130 and the first data line 140-1. Similarly, the third LED chip 120-3 or the infrared LED chip 1201R provided in the second pixel 110A-2 can emit light by selecting the scanning line 130 and the second data line 140-2.

In the second pixel 110A-2, the third LED chip 120-3 and the infrared LED chip 1201R are electrically connected in parallel. However, the third LED chip 120-3 and the infrared LED chip 1201R are connected in parallel so that their polarities are opposite to each other. That is, when current is supplied to the third LED chip 120-3, no current is supplied to the infrared LED chip 1201R. Similarly, when current is supplied to the infrared LED chip 1201R, no current is supplied to the third LED chip 120-3.

Although not shown in the diagram, the first potential of the first power supply voltage line 180-1 is different from the second potential of the second power supply voltage line 180-2. When the first potential is larger than the second potential, current is supplied only to the third LED chip 120-3 from the first power supply voltage line 180-1. That is, the third LED chip 120-3 is in a light emitting state, and the infrared LED chip 1201R is in a non-light emitting state. On the other hand, when the second potential is larger than the first potential, current is supplied only to the infrared LED chip 1201R from the second power supply voltage line 180-2. That is, the infrared LED chip 1201R is in a light emitting state, and the third LED chip 120-3 is in a non-light emitting state. Therefore, one LED chip 120 of the two LED chips 120 in the second pixel 110A-2 can be in a light emitting state and the other LED chip 120 can be used as a protection diode.

In the second subframe period, the second potential of the second power supply voltage line 180-2 is a high potential, and the first potential of the first power supply voltage line 180-1 is a low potential. Therefore, during the second subframe period, the second LED chip 120-2 in the first pixel 110-1 and the infrared LED chip 120IR in the second pixel 110A-2 are in a light emitting state. Further, when the second data line 140-2 is selected, light emission from the fourth LED chip 120-4 in the second pixel 110A-2 becomes possible.

A configuration of the pixel 110A of the display device 20 is described with reference to FIG. 7.

Figure 7:
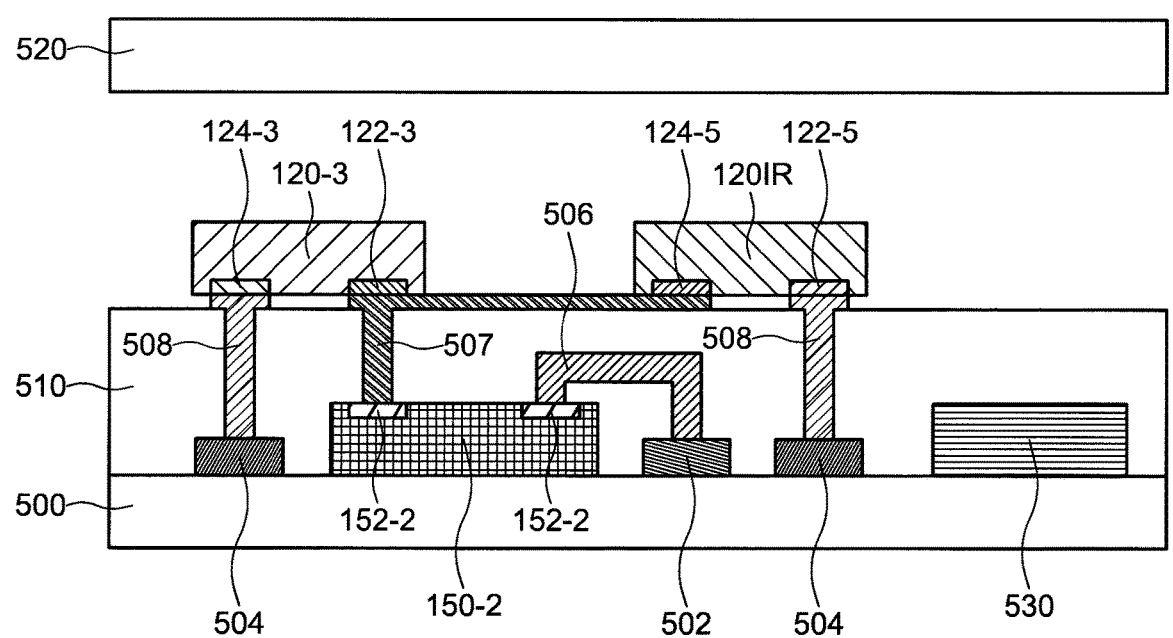
FIG. 7 is a cross-sectional view of a display portion of a display device according to an embodiment of the present invention.

FIG. 7 is a cross-sectional view of the pixel 110A of the display device 20 according to the embodiment of the present invention. Specifically, FIG. 7 is a cross-sectional view of the second pixel 110A-2.

As shown in FIG. 7, the second pixel 110A-2 includes the substrate 500, the first wiring layer 502, the second wiring layer 504, the third wiring layer 506, the fourth wiring layer 507, the fifth wiring layer 508, the protection layer 510, a protective cover 520, a light receiving element 530, the third LED chip 120-3, the infrared LED chip 120IR, and the second drive transistor 150-2. The second pixel 110A-1 also includes the second selection transistor 160-2 and the second capacitance element 170-2. The second selection transistor 160-2 can have the same configuration as the second drive transistor 150-2, and the second capacitance element 170-2 has a configuration using the insulating layer and electrodes of the second drive transistor 150-2. Therefore, the description of the configuration of the second selection transistor 160-2 and the second capacitance element 170-2 is omitted here.

The third LED chip 120-3 includes the third anode 122-3 and the third cathode 124-3. The infrared LED chip 120IR includes a fifth anode 122-5 and a fifth cathode 124-5.

As shown in FIG. 7, the first wiring layer 502, the second wiring layer 504, the light receiving element 530, and the second drive transistor 150-2 are provided over the substrate 500. Further, a protection layer 510 is provided so as to cover the first wiring layer 502, the second wiring layer 504, the light receiving element 530, and the second drive transistor 150-2. The third wiring layer 506 may be provided in the protection layer 510. Each of the fourth wiring layer 507 and the fifth wiring layer 508 is provided on the opening of the protection layer 510 and the protective layer 510. Each of the third LED chip 120-3 and the infrared LED chip 120IR is provided on the third wiring layer 506 and the fourth wiring layer 508. The protective cover 520 is provided over the third LED chip 120-3 and the infrared LED chip 120IR.

The protective cover 520 can protect the third LED chip 120-3 and the infrared LED chip 120IR. The protective cover 520 can be provided with a gap between the protective cover 520 and the third LED chip 120-3 and the infrared LED chip 120IR. In this case, the protective cover 520 is preferably adhered to the substrate 500 or the protective layer 510. Further, the protective cover 520 may be provided by filling an adhesive between the protective cover 520 and the third LED chip 120-3 and the infrared LED chip 120IR. The same substrate as the substrate 500 can be used as the protective cover 520. The protective cover 520 preferably has transparency.

The light receiving element 530 can receive infrared rays and convert them into an electric signal. The light receiving element 530 is preferably a photodiode. For example, a material having a band gap corresponding to the wavelength of the infrared rays such as amorphous silicon can be used as the semiconductor layer of the photodiode.

The display device 20 can perform biometric authentication using the infrared LED chip 120IR and the light receiving element 530. Therefore, a method of biometric authentication in the display device 20 is described with reference to FIGS. 8A and 8B.

Figure 8A:
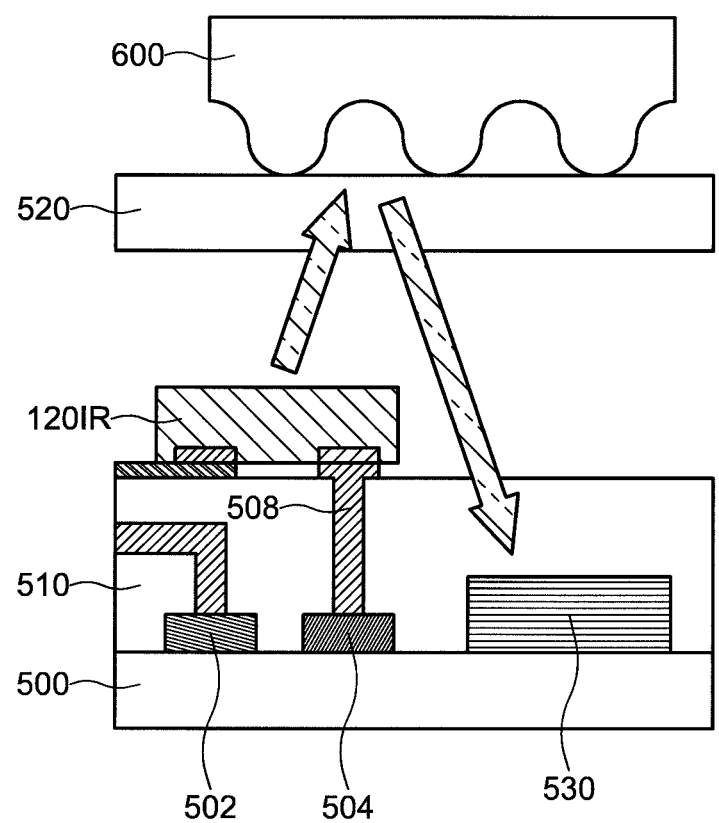
FIG. 8A is a diagram illustrating a method of biometric authentication in a display device according to an embodiment of the present invention.
Figure 8B:
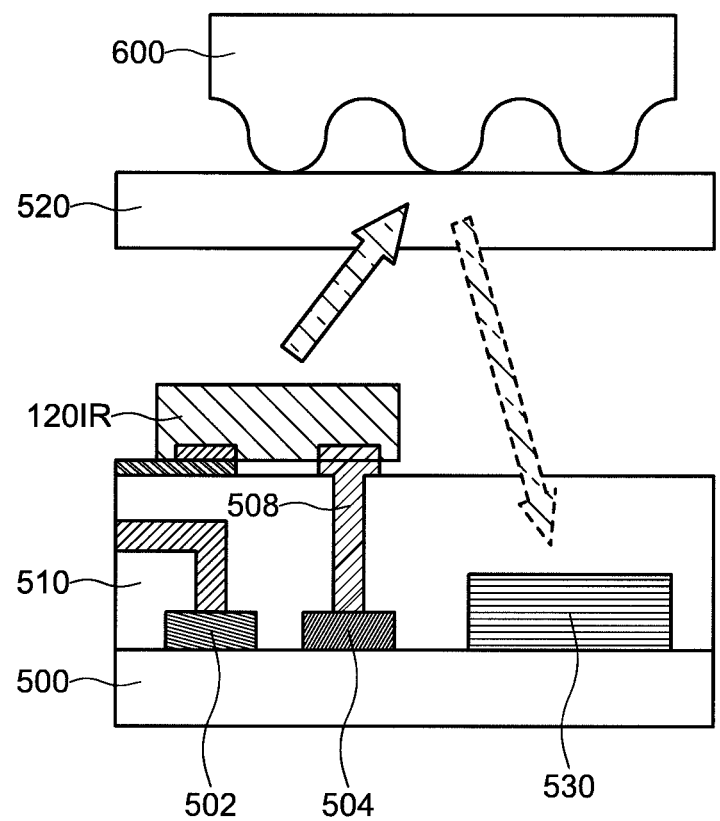
FIG. 8B is a diagram illustrating a method of biometric authentication in a display device according to an embodiment of the present invention.

FIGS. 8A and 8B are diagrams illustrating the method of biometric authentication in the display device 20 according to the embodiment of the present invention. In the following description, although fingerprint authentication is described as an example of biometric authentication in the display device 20, the biometric authentication method is not limited to this. The biometric authentication in the display device 20 can also be applied to, for example, vein authentication or palm print authentication.

As shown in FIG. 8A, a finger 600, which is an object of fingerprint authentication, is placed on the protective cover 520 of the display device 20. The finger 600 has protrusions and recesses on its surface that constitute a fingerprint. Therefore, when the finger 600 is placed on the protective cover 520, there are convex portions that contact the protective cover 520 and concave portions that do not contact the protective cover 520.

In the display device 20, infrared light is emitted from the infrared LED chip 120IR during the second subframe period. The emitted infrared light passes through the protective cover 520 and is reflected at the interface between the protective cover 520 and the finger 600. The reflected light is detected by the light receiving element 530 and converted into an electric signal. Here, as shown in FIG. 8A, in the recess of the fingerprint, total reflection occurs at the interface between the protective cover 520 and the recess. Therefore, the intensity of the reflected light is hardly decreased in the concave portions of the fingerprint. On the other hand, as shown in FIG. 8B, in the convex portions of the fingerprint, diffuse reflection occurs at the interface between the protective cover 520 and the convex portions. Infrared light is also absorbed by the veins of the finger 600. Therefore, the intensity of the reflected light is greatly decreased at the convex portions of the fingerprint. That is, the reflected light becomes stronger in the convex portions of the fingerprint, and the reflected light becomes weaker in the concave portions of the fingerprint. Therefore, the fingerprint authentication of the finger 600 can be performed by detecting the intensity of the reflected light with the light receiving element 530.

As described above, in the display device 20 according to the second embodiment, two LED chips 120 can be driven by using one pixel circuit. Therefore, the number of pixel circuits formed in the display region 100A can be reduced. In addition, the number of pixels in the display region 100A can be increased. Therefore, the display device 20 is a high-definition display device. Further, since the number of pixel circuits formed in the display region 100A can be reduced, the aperture ratio of the display region 100A can be increased. Therefore, since the display region 100A has high transparency, the display device 20 is a display device having high transparency. Furthermore, in the display device 20, one of the two LED chips 120 can be in a light emitting state and the other LED chip 120 can use as a protection diode. Therefore, the display device 20 is a display device having a high electrostatic withstand voltage.

Further, the display device 20 is a display device capable of biometric authentication by providing an infrared LED chip 1201R and a light receiving element 530 in the pixel 110A. Since the infrared LED chip 1201R can be mounted in the same manner as the other LEDs 120 and the pixel circuit can be commonly used, manufacturing costs of the display device 20 can be suppressed.

In the second embodiment, although the display device using the infrared LED chip is described, the display device 20 may be provided with the LED chip 120 according to the intended use. That is, the second pixel 110A-2 can be a sensor other than biometric authentication. For example, the LED chip 120 mounted in the second pixel 110A-2 is not limited to the infrared LED chip 1201R, and can be replaced with invisible light such as an ultraviolet LED chip or a radiation source such as X-rays.

Third Embodiment

A configuration of the display device 30 according to the embodiment of the present invention is described with reference to FIG. 9.

Figure 9:
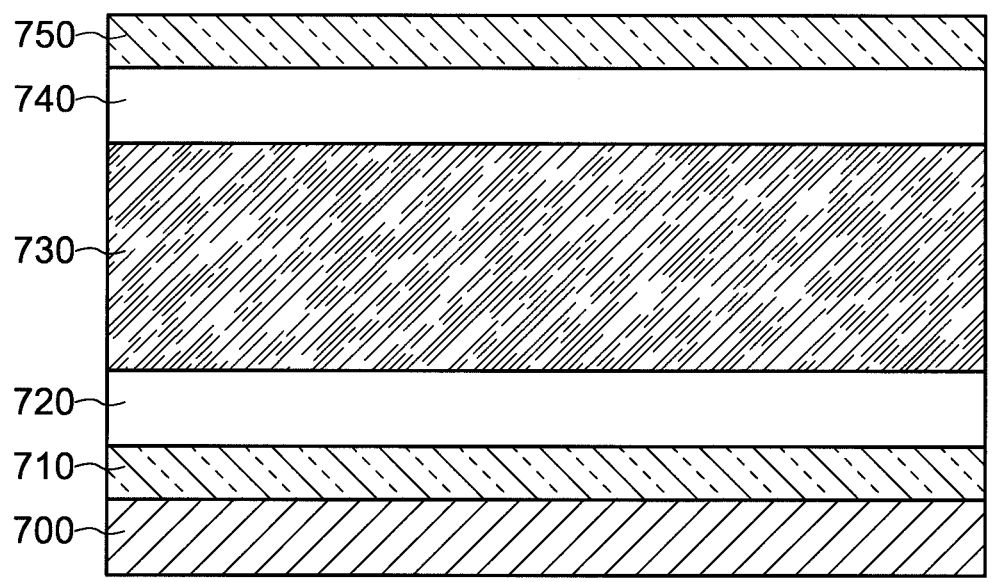
FIG. 9 is a cross-sectional view of a display device according to an embodiment of the present invention.

FIG. 9 is a cross-sectional view of the display device 30 according to the embodiment of the present invention.

As shown in FIG. 9, the display device 30 includes a light source 700, a first polarizing plate 710, a first substrate 720, a liquid crystal element 730, a second substrate 740, and a second polarizing plate 750. That is, the display device 30 is a liquid crystal display device using the liquid crystal element 730.

The light source 700 functions as a backlight of the liquid crystal element 730. The LED chip 120 can be used for the light source 700. Specifically, the light source 700 can be a light source in which a plurality of red LED chips, green LED chips, blue LED chips, and white LED chips are arranged in a matrix to obtain white light. Further, the red LED chip, the green LED chip, the blue LED chip, and the white LED chip can have the same configuration as the pixel 110 of the display device 10 of the first embodiment. That is, even in the light source 700, two LED chips 120 can be driven by using one pixel circuit.

Further, the light source 700 may be divided into several sections, each section may be provided with a red LED chip, a green LED chip, a blue LED chip, and a white LED chip, and the LED chips 120 may be controlled in each section. That is, the light source 700 may be provided with one section for a plurality of pixels of the display portion. By having such a configuration of the light source 700, the number of LED chips 120 provided in the light source 700 can be reduced. Furthermore, since the distance between the LED chips 120 arranged in the light source 700 can be separated, the aperture ratio of the light source 700 becomes high. Therefore, the display device 30 is a display device having high transparency.

Further, the light source 700 may include a lens or a diffuser in order to reduce the luminance nonuniformity.

Although the light source 700 shown in FIG. 9 has a so-called direct light type configuration provided in a flat surface portion of the display device 30, the configuration of the light source 700 is not limited to this. The light source 700 may have a so-called edge light type configuration provided at the edge of the display device 30.

The first polarizing plate 710 and the second polarizing plate 750 can polarize the light emitted from the light source 700 in a certain direction. The first polarizing plate 710 and the second polarizing plate 750 can be provided with so-called cross Nicols whose transmission axes are orthogonal to each other.

The first substrate 720 and the second substrate 740 can support and protect the liquid crystal element 730. The same substrate as the substrate 500 can be used as the first substrate 720 and the second substrate 740. The first substrate 720 and the second substrate 740 are preferably transparent.

The liquid crystal element 730 includes a liquid crystal and an electrode that applies a voltage to the liquid crystal. The liquid crystal element 730 may be a horizontal electric field drive system in which electrodes are provided on one side of the liquid crystal display, or a vertical electric field drive system in which the liquid crystals are sandwiched by the electrodes.

Further, since the liquid crystal element 730 displays in full color, a color filter can be included.

As described above, in the display device 30 according to the third embodiment, two LED chips can be driven by using one pixel circuit in the light source 700. Further, one LED chip 120 of the two LED chips 120 can be in a light emitting state and the other LED chip 120 can be used as a protection diode. Therefore, the display device 30 is a display device having a high electrostatic withstand voltage.

Each of the embodiments described above as an embodiment of the present invention can be appropriately combined and implemented as long as they do not contradict each other. Additions, deletion, or design changes of constituent elements, or additions, omissions, or changes to conditions of steps as appropriate based on the respective embodiments are also included within the scope of the present invention as long as the gist of the present invention is provided.

Other effects which differ from those brought about by each of the above described embodiments, but which are apparent from the description herein or which can be readily predicted by those skilled in the art, are naturally understood to be brought about by the present invention.

What is claimed is:

1. A display device comprising:
    a plurality of first pixels; and
    a plurality of second pixels,
    wherein each of the plurality of first pixels comprises:
        a first LED chip comprising a first anode and a first cathode;
        a second LED chip comprising a second anode and a second cathode; and
        a first transistor,
    one of source and drain electrodes of the first transistor is electrically connected to a first power supply voltage line,
    another of the source and drain electrodes is electrically connected to the first anode and the second cathode,
    the first cathode and the second anode are electrically connected to a second power supply voltage line,
    a first potential of the first power supply voltage line is different to a second potential of the second power supply voltage line,
    the first LED chip emits a first color, and
    the second LED chip emits a second color different from the first color.

2. The display device according to claim 1, wherein the second LED chip is in a non-light emitting state when the first potential is larger than the second potential.

3. The display device according to claim 2, wherein the first LED chip is in a non-light emitting state when the second potential is larger than the first potential.

4. The display device according to claim 1,
wherein each of the plurality of second pixels comprises:
a third LED chip comprising a third anode and a third cathode;
a fourth LED chip comprising a fourth anode and a fourth cathode; and
a second transistor,
the third LED chip and the fourth LED chip are electrically connected in parallel,
one of source and drain electrodes of the second transistor is electrically connected to the first power supply voltage line,
another of the source and drain electrodes of the second transistor is electrically connected to the third anode and the fourth cathode,
the third cathode and the fourth anode are electrically connected to the second power supply line,
the third LED chip emits a third color different from the first color and the second color, and
the fourth LED chip emits a fourth color different from the first color, the second color, and the third color.

5. The display device according to claim 4, wherein the fourth LED chip is in a non-light emitting state when the first potential is larger than the second potential.

6. The display device according to claim 5, wherein the third LED chip is in a non-light emitting state when the second potential is larger than the first potential.

7. The display device according to claim 4, wherein a first subframe period in which the first potential is larger than the second potential and a second subframe period in which the second potential is larger than the first potential are sequentially selected.

8. The display device according to claim 7, wherein in the first subframe period, a first scanning line connected to the first LED chip and a second scanning line connected to the third LED chip are sequentially selected.

9. The display device according to claim 8, wherein in the second subframe period, the first scanning line connected to the second LED chip and the second scanning line connected to the fourth LED chip are sequentially selected.

10. The display device according to claim 7, wherein in each of the first subframe period and the second subframe period, a first data line connected to the first LED chip and a second data line connected to the second LED chip are sequentially selected.

11. The display device according to claim 4,
wherein the first LED chip is a red LED chip, and
the second LED chip is a green LED chip.

12. The display device according to claim 11,
wherein the third LED chip is a blue LED chip, and
the fourth LED chip is a white LED chip.

13. The display device according to claim 4, wherein one of the first LED chip, the second LED chip, the third LED chip, and the fourth LED chip is an infrared LED chip.

14. The display device according to claim 1, wherein the plurality of first pixels and the plurality of second pixels are arranged in a display portion.

15. The display device according to claim 14, wherein the display portion has transparency.

16. The display device according to claim 1, further comprising a display portion comprising a liquid crystal,
wherein the plurality of first pixels and the plurality of second pixels are arranged in a light source.

17. The display device according to claim 16, wherein the display portion has transparency.

18. The display device according to claim 1,
wherein each of the plurality of first pixels further comprises:
a first capacitance element, and
a capacitance line;
one of electrodes of the first capacitance element is electrically connected to a gate electrode of the first transistor, and
another of the electrodes of the first capacitance element is electrically connected to the capacitance line.

19. The display device according to claim 4,
wherein each of the plurality of first pixels further comprises:
a first capacitance element, and
a capacitance line;
each of the plurality of second pixels further comprises:
a second capacitance element, and
the capacitance line;
one of electrodes of the first capacitance element is electrically connected to a drain electrode of the first transistor,
another one of the electrodes of the first capacitance element is electrically connected to the capacitance line,
one of electrodes of the second capacitance element is electrically connected to a gate electrode of the second transistor, and
another of the electrodes of the second capacitance element is electrically connected to the capacitance line.

* * * * *